(«12») United States Patent
Hsieh

(10) Patent No.: US 8,030,702 B2
(45) Date of Patent: Oct. 4, 2011

(54) TRENCHED MOSFET WITH GUARD RING AND CHANNEL STOP

(75) Inventor: Fu-Yuan Hsieh, Hsinchu (TW)

(73) Assignee: Force MOS Technology Co., Ltd., Hsinchu (TW)

( * ) Notice: Subject to any disclaimer, the term of this patent is extended or adjusted under 35 U.S.C. 154(b) by 173 days.

(21) Appl. No.: 12/605,096

(22) Filed: Oct. 23, 2009

(65) Prior Publication Data

US 2010/0038711 A1   Feb. 18, 2010

Related U.S. Application Data

(63) Continuation-in-part of application No. 12/111,747, filed on Apr. 29, 2008, now abandoned.

(51) Int. Cl.
*H01L 29/76* (2006.01)
*H01L 29/94* (2006.01)

(52) U.S. Cl. ........ 257/330; 257/331; 257/341; 257/409; 438/270

(58) Field of Classification Search .................. 257/328, 257/330–331, 341, 409, E21.615, E27.081; 438/270

See application file for complete search history.

(56) References Cited

U.S. PATENT DOCUMENTS

| 6,049,108 A * | 4/2000 | Williams et al. ............... 257/341 |
| 6,351,018 B1 * | 2/2002 | Sapp ............................. 257/499 |

* cited by examiner

*Primary Examiner* — Theresa T Doan
(74) *Attorney, Agent, or Firm* — Birch, Stewart, Kolasch & Birch, LLP

(57) ABSTRACT

A trenched MOSFET (Metal-Oxide-Semiconductor Field Effect Transistor) with a guard ring and a channel stop, including: a substrate including an epi layer region on the top thereof; a plurality of source and body regions formed in the epi layer; a metal layer including a plurality of metal layer regions which are connected to respective source and body, and gate regions forming metal connections of the MOSFET; a plurality of metal contact plugs connected to respective metal layer regions; a plurality of gate structure filled with polysilicon to form a plurality of trenched gates on top of epi layer; an insulating layer deposited on the epi layer formed underneath the metal layer with a plurality of metal contact holes therein for contacting respective source and body regions; a guard ring wrapping around the metal layer corresponding to the gate region at the termination; and a channel stop which is a heavier N-type doping region aside the guard ring at the termination; Wherein the contact plugs connecting to the top metal layer are corresponding to the source and the body regions.

8 Claims, 8 Drawing Sheets

TRENCHED MOSFET WITH GUARD RING AND CHANNEL STOP

CROSS REFERENCE

This application is a continuation-in-part of U.S. patent application Ser. No. 12/111,747 filed on Apr. 29, 2008 now abandoned, which is incorporated herewith by reference.

BACKGROUND OF THE INVENTION

1. Field of the Invention

The present invention relates to a trenched MOSFET structure with a guard ring and a channel stop and a method for manufacturing thereof, and more particularly to a structure of a trenched MOSFET which solves current leakage, and a method for manufacturing the same.

2. The Prior Arts

In the structure of a trench Metal-Oxide-Semiconductor Field Effect Transistor (MOSFET) or vertical transistor, the gate of the transistor is formed in a trench on top of a substrate and the source/drain regions are formed on both sides of the gate. This type of vertical transistor allows high current to pass through and channel to be turned on/off at a low voltage.

Referring to FIG. 1, a cross-sectional diagram of the structure of a trenched MOSFET is shown. An N-type doping epitaxial region 105 is provided on a N+ substrate 100. A plurality of trenches 106 and a trench 107 are formed on the N-type doping epitaxial region 105 that having lower doping concentration than the substrate 100, and the trench 107 is wider and deeper than the trenches 106. The surface of trenches 106 and the trench 107 which are covered a gate oxide layer 110 thereon are filled with a polysilicon layer to form a plurality of trenched gates 115 and a wide trenched contact gate 116 respectively. A plurality of P-type doping regions 120 are formed on both sides of the trenched gates 115, and a P-type doping regions 120a is formed on the other side from the P-type doping regions 120 of the wide trenched contact gate 116. A plurality of N+ doping regions 125 are formed in the P-type doping regions 120, and the N+ doping regions 125 are used as the source regions of the MOSFET structure. A metal layer 160 is formed on the top of the MOSFET structure and is formed as the source metal, the gate runner, and the field plate metal of the MOSFET. An insulating layer 130 is formed under the metal layer 160 for insulating from the trenched gates 115 and the wide trenched gate 116, and the contact plugs 137 are formed in the P-type doping regions 120 and the wide trenched gate 116 for gate contact. The contact plugs 137 been the metal connections of the MOSFET structure respectively contact the doped polysilicon at the bottoms of the trenches 106 and the trench 107 without shorting to the P-type doping regions 120 and are penetrated through the insulating layer 130 to contact with the metal layer 160. A plurality of P+ heavily-doped regions 121 are formed at the bottoms of the trenched gates 115. The MOSFET structure of the prior arts also has a P-type guard ring 170 which is formed aside the P-type doping regions 120a underneath the field plate metal of the metal layer 160 of the MOSFET to increase breakdown voltage in termination. However, the structure in FIG. 1 has low breakdown voltage occurring on trench bottom of the wide trenched gate 116 as result of wider trench which has deeper trench depth than the trench depth in active area. The trench depth is deeper when the trench width is wider because more open area allows more etching gas goes into trench during dry etching silicon process. When reverse bias between drain and gate/source increases, avalanche will first occur on the trench bottom of the contacted trenched gate 116 because it has deeper trenched gate.

As said above, the avalanche early occurs near trench contacted gate due to deeper trench than trench gate in active area as result of bigger CD of trench contacted gate than the trench gate in active area. The trench contacted gate is wider than trench gate in active to allow enough space for trench gate contact without shortage source area. BV instability in termination due to high epi resistivity easily causing net positive charge at interface between dielectric and silicon layer induced by negative charge in dielectric layer. A leakage path 190 is formed as shown in FIG. 1 below.

The present invention provides a new structure of trenched MOSFET structure with a guard ring wrapped around the contacted trenched gate which improves the lack of the prior art.

SUMMARY OF THE INVENTION

This invention provides a trenched MOSFET (Metal-Oxide-Semiconductor Field Effect Transistor) with a guard ring and a channel stop, comprising: a substrate comprised an epi layer region on the top thereof; a plurality of source and body regions formed in the epi layer; a metal layer comprised a plurality of metal layer regions which are connected to respective source and body, and gate regions forming metal connections of the MOSFET; a plurality of metal contact plugs connected to respective metal layer regions; a plurality of gate structure filled with polysilicon to form a plurality of trenched gates on top of epi layer; an insulating layer deposited on the epi layer formed underneath the metal layer with a plurality of metal contact holes therein for contacting respective source and body regions; a guard ring wrapping around the metal layer corresponding to the gate region at the termination; and a channel stop which is a heavier N-type doping region aside the guard ring at the termination; Wherein the contact plugs connecting to the top metal layer are corresponding to the source and the body regions.

The trenched MOSFET with a guard ring and a channel stop of the invention further comprises a plurality of bottom N* doping regions formed underneath bottom of the trenched gates.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

Figure 1:
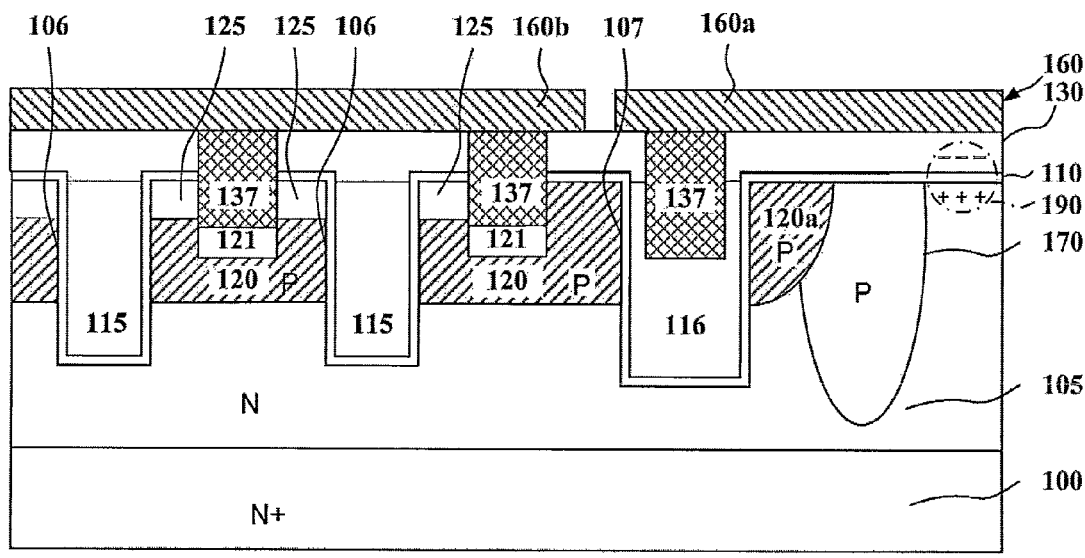
FIG. 1 is a cross-sectional diagram depicting a trenched MOSFET structure with a guard ring.

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

The present invention provides a trenched MOSFET with a guard ring and a channel stop, comprising: a substrate of a first conductivity doping type including an epi layer of the first conductivity doping type formed on the top thereof with doping concentration less than the substrate; a plurality of sources of the first conductivity doping type formed in the epi layer and a plurality of body regions of a second conductivity doping type formed beneath the sources in the epi layer; an insulating layer formed on the epi layer; a plurality of a first type trenches vertically extending from a surface of the epi layer into the source and the body regions and having an gate oxide layer formed thereon, the first type trenches being filled with a doped polysilicon layer as trenched gates for current conduction; at least one second type trench having an gate oxide layer formed thereon, the second type trench being deeper and wider than the first type trench vertically extending from the surface of the epi layer into the body regions, the second type trench filled with the doped polysilicon as trenched contact gate; a first metal contact plug penetrating through the insulating layer and extending into the second type trench, the first metal contact plug being connected to a first metal layer formed on the insulating layer, the first metal contact serving as gate metal in a termination area of a chip; a plurality of second metal contact plugs, each penetrating through the insulating layer and one of the source, and extending into the body regions separated by the first type trenches and the second type trenches, the metal contact plugs being connected to a second metal layer formed on the insulating layer, the second metal layer serving as source metal; a guard ring formed in the termination area of the chip, the guard ring extending inwardly from the top surface of the epi layer having the second conductivity doping type, the guard ring having a junction depth deeper than that of the body region, the guard ring contacting the body region with doping concentration less than the body region; and a channel stop region formed beneath the top surface of the epi layer near an edge of the chip, the channel stop region contacting the guard ring in the termination area and having the first conductivity doping type with doping concentration heavier than the epi layer, wherein the gate metal above the guard ring in the termination area serving as a metal field plate for breakdown voltage enhancement.

Among them, the guard ring is arranged outside of the trenched contact gate. Alternatively, the guard ring surrounds the trenched contact gate region. Furthermore, the MOSFET structure comprises a plurality of transistors formed in a N-type doping epi region on the heavily doped N-type substrate. Moreover, the trench MOSFET further comprises a plurality of doping regions of the first conductivity doping type, each of the doping regions is arranged underneath a bottom of one of the trenched gates with doping concentration heavier than the epi layer for lower on-resistance (Rds). In addition, a plurality of heavily p-type doped regions are disposed at the bottoms of the metal contact plugs. Moreover, the gate oxide layer in trenched gates is single oxide of which oxide thickness nearly uniform along trench sidewall and bottom. Furthermore, the gate oxide layer at the bottoms of the trenched gates has a significant larger thickness than trench sidewall so as to reduce the capacitance of the gate oxide layer.

Figure 2A:
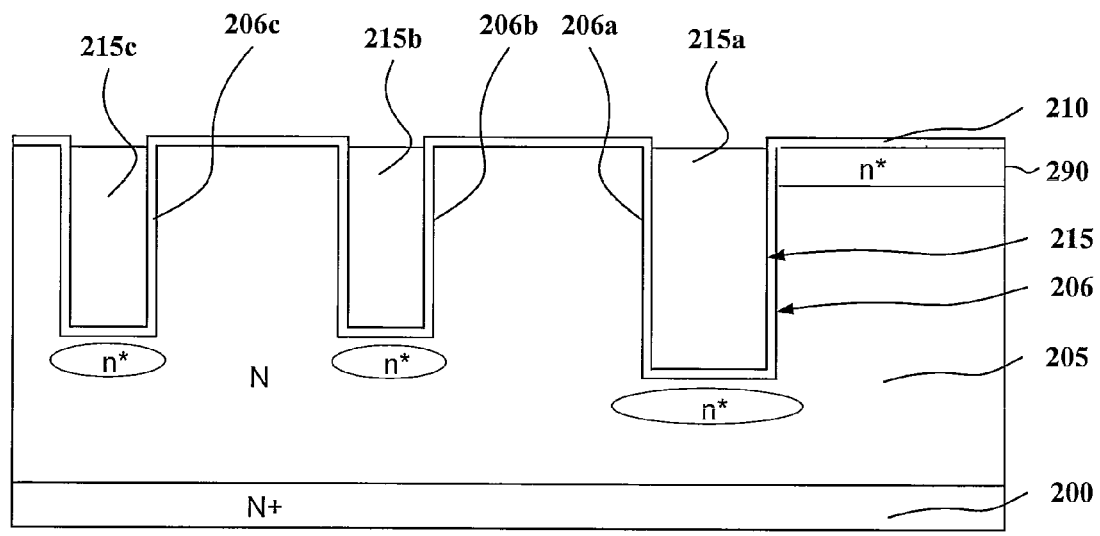
FIGS. 2A to 2G are cross-sectional diagrams illustrating forming a trenched MOSFET with guard ring and channel stop on a substrate in accordance with an embodiment of the present invention.

Referring to FIG. 2A, an N+ doped substrate 200 having a N-type doping epi layer region 205 thereon is provided. Lithography and dry etching processes are performed to form a plurality of trenches 206 in the N-type epi layer 205. The trenches 206 comprise a first trench 206a, a second trench 206b, and a third trench 206c, and the first trench 206a is deeper and wider than both of the second trench 206b and third trench 206c. Then, a deposition or thermally grown process is performed to form a silicon oxide layer on the surface of the N-type doping region 205 and the trenches 206, which acts as a gate oxide layer 210 of a trenched MOSFET. Prior to the gate oxide layer 210 is formed, a sacrificial oxide is grown and wet etched for removal silicon damage along the trench 206 surface induced by the dry trench etch. Thereafter, a N-type doping layer 290 and a plurality of bottom N* doping regions 291 are formed by an ion implantation process, which can be an arsenic or phosphorus ion implantation, so that the N-type doping layer 290 and the bottom N+ doping regions 291 have more N-type implant concentration than the N-type doping epi layer region 205. The N-type doping layer 290 is formed on the top of the N-type doping epi layer region 205 and covered by the gate oxide layer 210. The bottom N* doping regions 291 are respectively formed underneath the first trench 206a, the second trench 206b, and the third trench 206c.

Figure 2B:
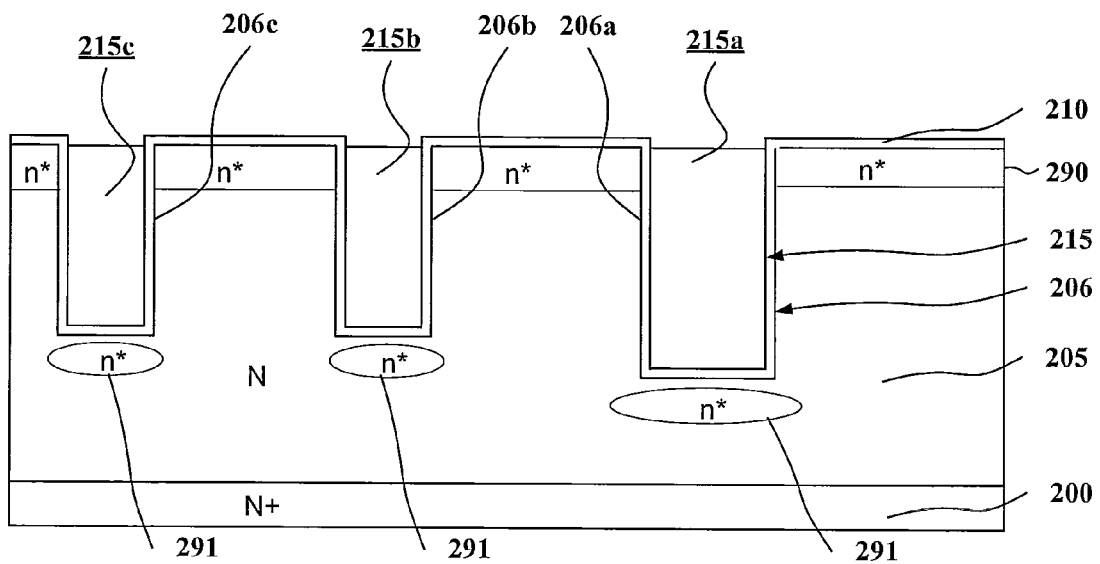

Referring to FIG. 2B, a doped polysilicon layer is formed on the gate oxide layer 210 and filled in the trenches 206 by a deposition process. Thereafter, the doped polysilicon layer on the gate oxide layer 210 is flated by a dry etching process or a CMP (chemical-mechanical polishing process) and the doped polysilicon layer on the each trench 206 is removed by a polysilicon etching back process, and a plurality of gate structures 215 of the trenched MOSFET in the trench are formed. The gate structure 215 comprise a first gate 215a, a second gate 215b, and a third gate 215c which are respectively formed on the first trench 206a, the second trench 206b, the third trench 206c. The first gate 215a is deeper than the second gate 215b and the third gate 215c because the first gate 215a in active area has wider open area to allow more etching gas goes into trench during dry etching silicon process for containing a metal contact plug described thereinafter. Therefore, the first gate 215a can be called a wide trenched gate while the second gate 215b and the third gate 215c can be called narrow trenched gates.

Figure 2C:
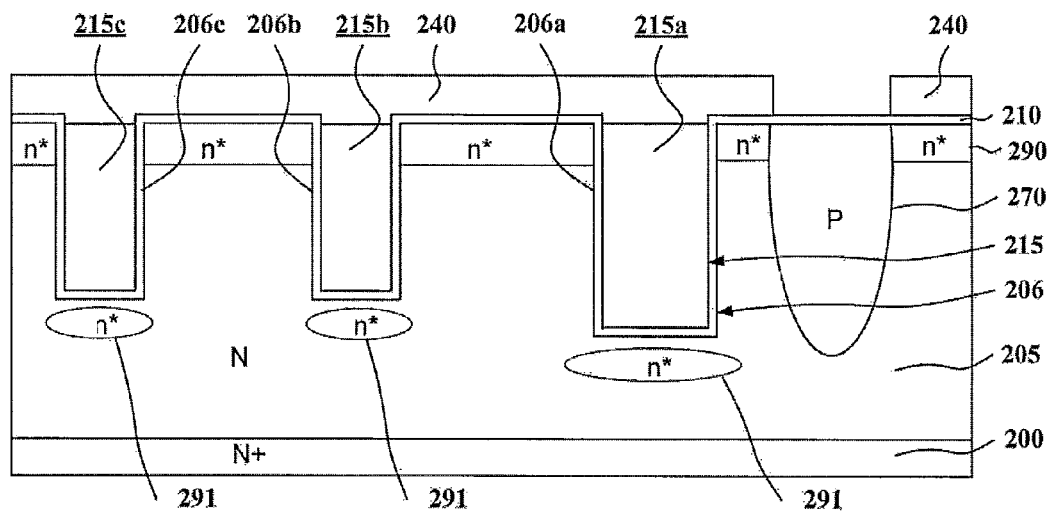

Referring to FIG. 2C, a first photo resist 240 is formed over the gate oxide layer 210 and the gate structure 215 by lithography to define a doping zone. Then, a P-type guard ring 270 with a doping concentration ranging from $10^{15} \sim 10^{17}$ cm$^{-3}$ are formed in the N-type doping region 205 and the N-type doping layer 290 aside the first gate 215a by an ion implantation and diffusion processes. After processes of forming the guard ring 270, the first photo resist 240 is removed.

Figure 2D:
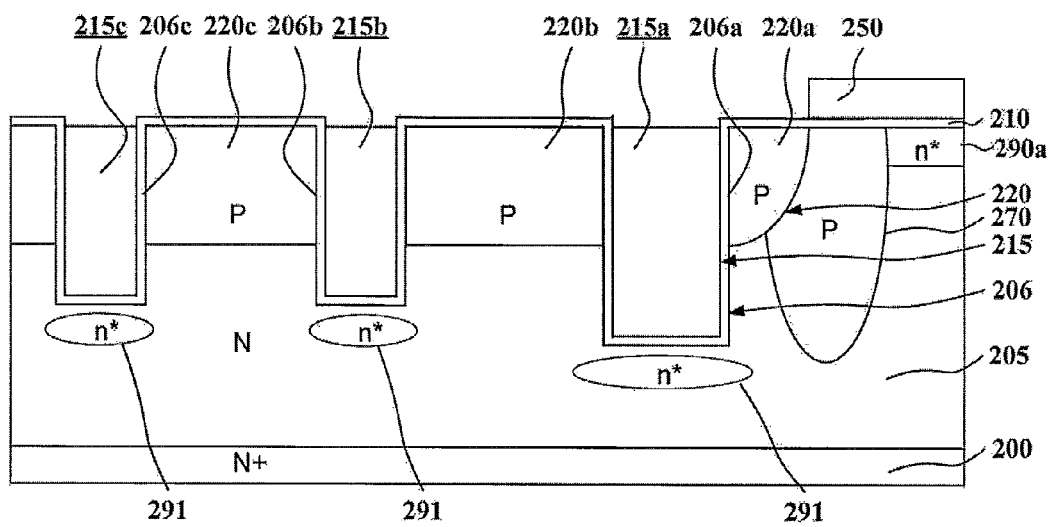
Figure 2E:
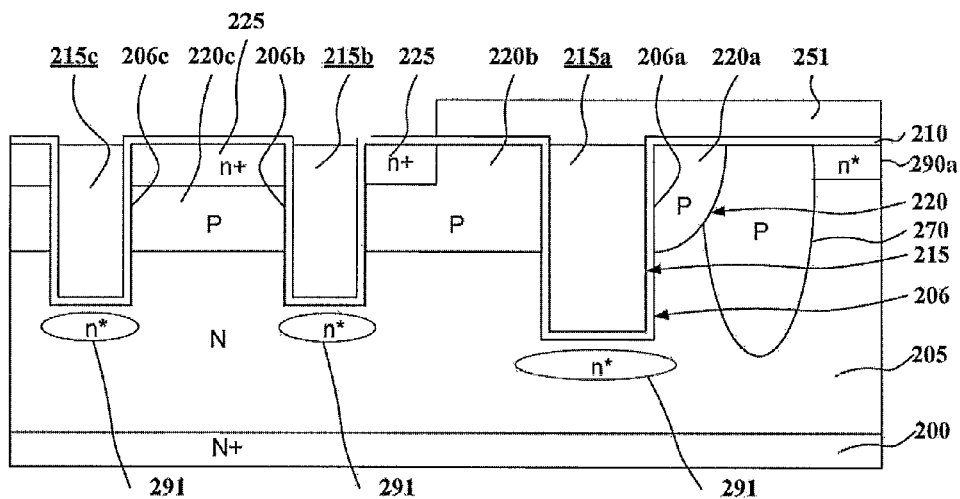

Referring to FIG. 2D and FIG. 2E, a second photo resist 250 (shown in FIG. 2C) is formed to define another doping zone, and a plurality of P-body regions 220 are formed in the N-type doping region 205 by an ion implantation and diffusion processes (showed as FIG. 2D). The P-body regions 220 comprises a first P-body region 220a formed between the first trench 206a and the guard ring 270, a second P-body region 220b formed between the trenches 206, and a third P-body region 220c formed between the trenches 206 also. Besides one part of the N-type doping layer 290 aside the guard ring 270, other parts of the N-type doping layer 290, corresponding to the first P-body region 220a, the second P-body region 220b, and the third P-body region 220c, are replaced by the P-body regions 220 and the part of the N-type doping layer 290 aside the P-Type guard ring 270 is defined a channel stop 290a. Thereafter, a third photo resist 251 (shown in FIG. 2E) is formed so as to facilitate formation of active N+ doping regions 225 in the second P-body region 220b and third P-body region 220c of the P-body regions 220 by ion implantation and thermal diffusion processes, and the third photo resist 251 is removed after the processes. The active N+ doping regions 225 are corresponding to the source of the trenched MOSFET.

Figure 2F:
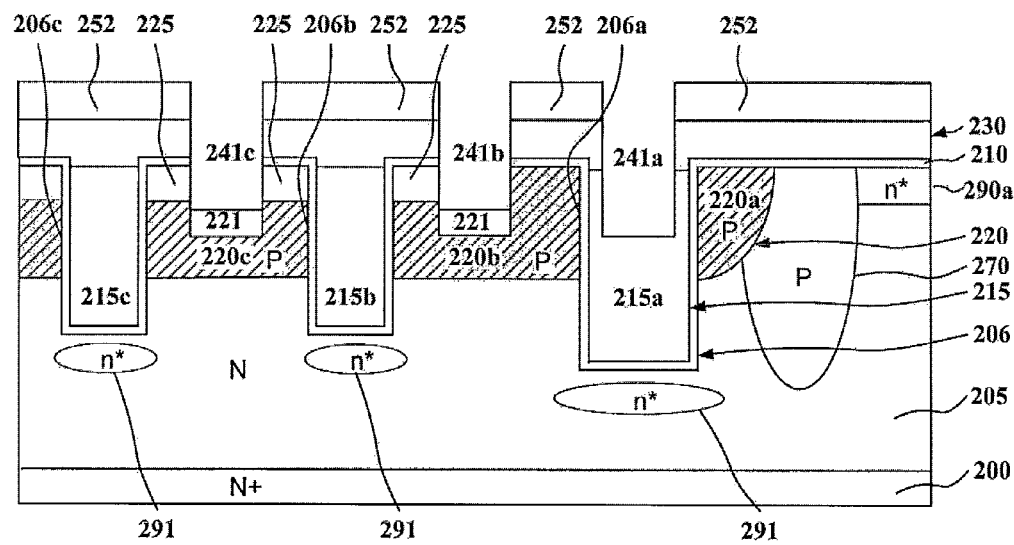

Referring to FIG. 2F, an insulating layer 230 is formed on the gate oxide layer 210 and the gate structure 215. This insulating layer 230 is a silicon dioxide layer formed by a deposition process. After the deposition of the insulating layer 230, a fourth photo resist 252 is formed on the surface of the insulating layer 230 by lithography. This fourth photo resist 252 defines the locations of metal contacts of the trenched MOSFET. Thereafter, a dry etching process is performed by using the fourth photo resist 252 as the etching photo resist, such that metal contact holes 241a, 241b, and 241c are formed in the insulating layer 230, the active N+ doping regions 225, the P-body regions 220, and the first gate 215a of the gate structures 215. The first metal contact hole 241a is corresponding to the first gate 215a while the second metal contact hole 241b and the third metal contact hole 241c are respectively corresponding to the second P-body region 220b and the third P-body region 220c. Then, an ion implantation process is carried out to form P+ heavily-doped regions 221 at the bottoms of contact 241b and 241c.

Figure 2G:
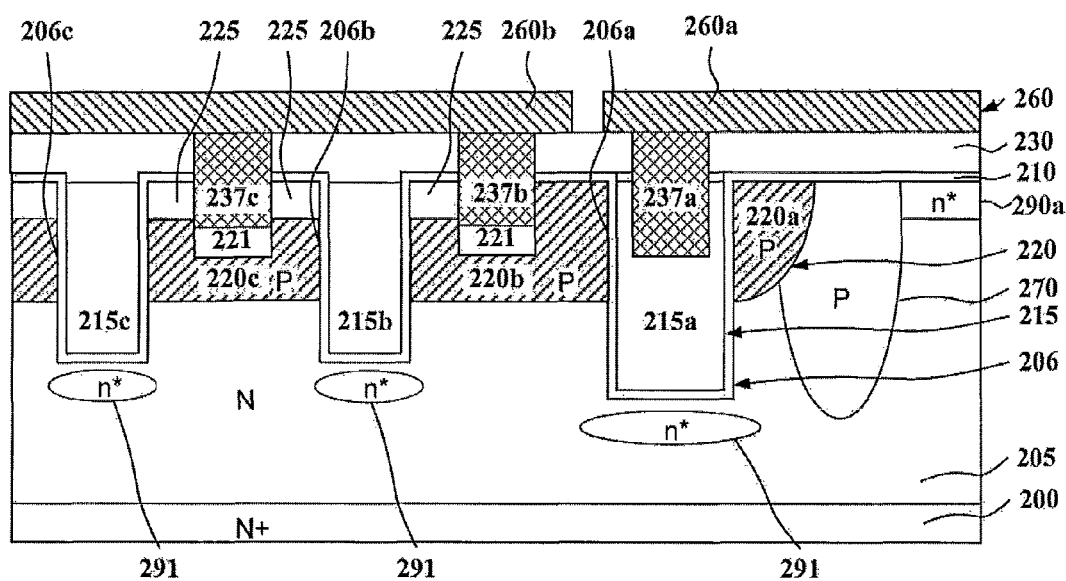

Referring to FIG. 2G, the metal contact holes 241a, 241b, and 241c can be filled with tungsten metal 237 to form the metal contact plugs 237a, 237b, and 2371c respectively. Besides tungsten metal, aluminum metal or copper metal is used as the contact plug or the front metal layer of the trenched MOSFET. After etch back of the contact metal 237, a metal layer Ti/Aluminum alloys 260 is deposited on the insulating layer 230, the first contact plug 237a, the second contact plug 237b, and the third contact plug 237c, and the metal layer 260 comprises a first metal layer region 260a and a second metal layer region 260b which are separated and are metal connections of the trenched MOSFET. The first metal layer region 260a is corresponding to connection of the first gate 215a, and the second metal layer region 260b is corresponding to a connection of both the source 225 and the P-body 220.

Referring to FIG. 2G again, the trenched MOSFET with a guard ring and a channel stop of the present invention has a MOSFET structure comprises the N+ doped substrate 200, the N-type doping epi layer region 205, the channel stop 290a, the Bottom N* doping regions 291, the plurality of trenches 206, the plurality of gate structure 215, the gate oxide layer 210, the plurality of P-body regions 220, the plurality of P+ heavily-doped regions 221, the plurality of active N+ doping regions 225, the insulating layer 230, the plurality of metal contact plugs (237a, 237b, and 237c), the metal layer 260, and the guard ring 270. The metal layer 260 comprised the first metal layer region 260a and the second metal layer region 260b which are formed on the top of the MOSFET structure, and the first metal layer region 260b and the second metal layer region 260a are formed as the source metal, and the gate and field plate metal of the MOSFET, respectively. The gate structure 215 comprised the first gate 215a, the second gate 215b, and the third gate 215c which are covered the gate oxide layer 210 and are filled in the trenches 260 to be used as the gate of the MOSFET. The insulating layer 230 is formed between the metal layer 260 and the gate structure 215 for insulating, and the metal contact plugs 237a, 237b, and 237c are penetrated through the insulating layer 230 and contacted with the metal layer 260. The channel stop 290a is formed at the termination aside the guard ring 270, and the bottom N+ doping regions 291 are formed underneath bottom of the trenches 206. The channel stop 290a provides heavier doping concentration than epi to avoid any negative charge in the dielectric inducing positive charge at silicon/dielectric interface to make high leakage path in termination area, and the Bottom N* doping regions 291 provide lower Rds without significantly degrading breakdown voltage.

Figure 3:
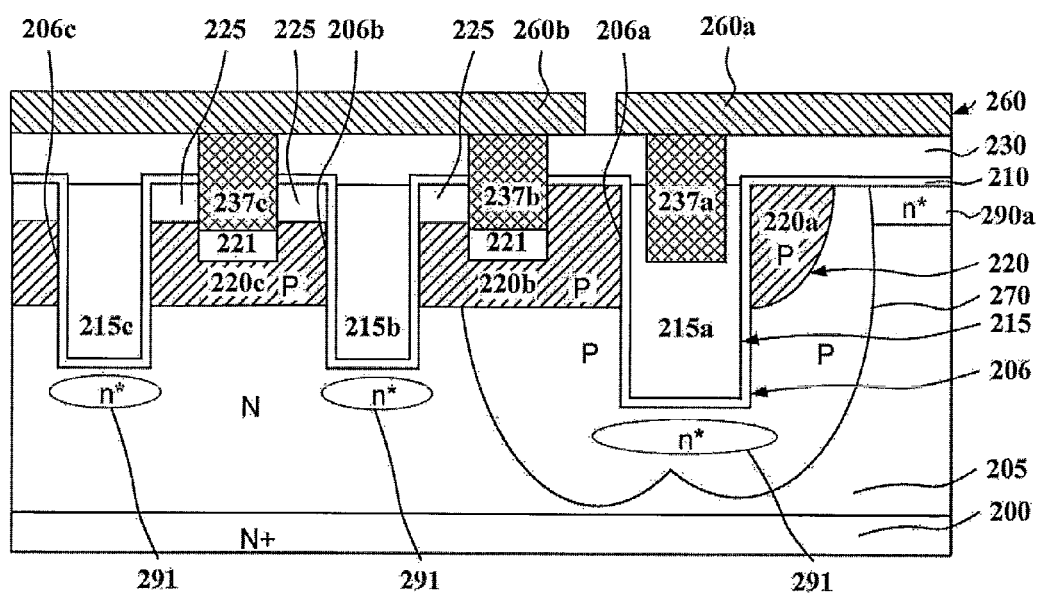
FIG. 3 is a cross-sectional diagram illustrating the trenched MOSFET with a guard ring and a channel stop in accordance with another embodiment of the present invention.

Referring to FIG. 3, the guard ring 270 wraps around the first contact plug 237a and the first gate 215a underneath the first gate 215a while the first metal layer region 260a of the metal layer 260 covers the first contact plug 237a and the first gate 215a. A part of the P+ heavily-doped regions 221 are formed at the bottom of the second gate 215b while the other P+ heavily-doped regions 221 are formed at the bottom of the third gate 215c. Moreover, the guard ring 270 can further wrap around the second contact plug 237b underneath the first gate 215a while the first metal layer region 260a and the second metal layer region 260b of the metal layer 260 covers the first contact plug 237a, and the second contact plug 237b, respectively. The guard ring 270 is corresponding to the source, the gate, and drain regions of the trenched MOSFET.

Figure 4:
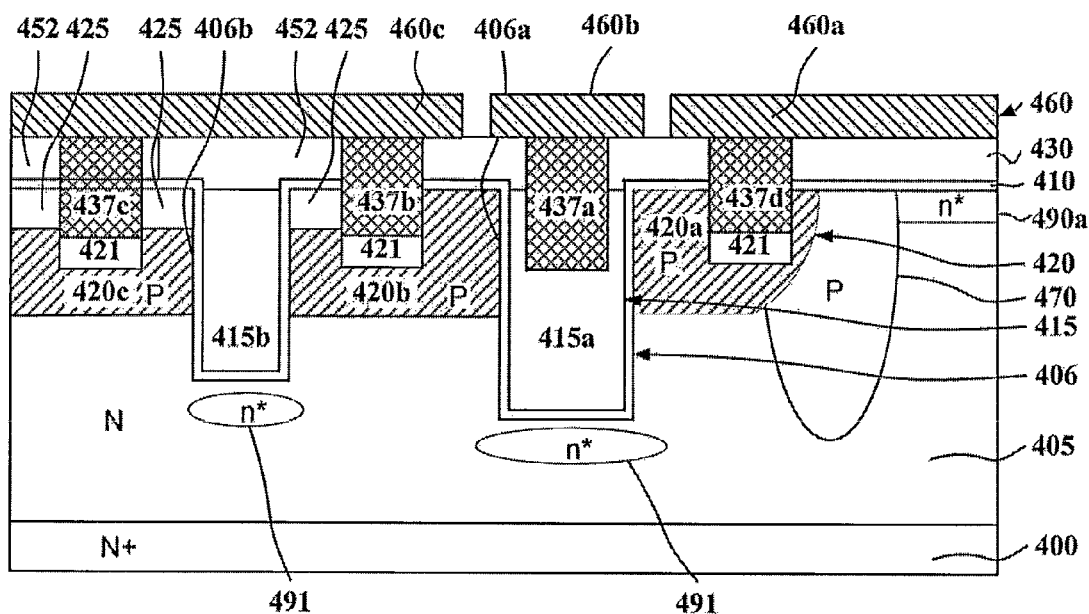
FIG. 4 is a cross-sectional diagram illustrating the trenched MOSFET with a guard ring and a channel stop in accordance with another embodiment of the present invention.

Referring to FIG. 4, a second embodiment of the present invention, the trenched MOSFET with a guard ring and a channel stop of the present invention is similar to the first embodiment of the present invention and has a MOSFET structure comprises a N+ doped substrate 400, a N-type doping epi layer region 405, a channel stop 490a, a N* doping regions 491, a plurality of trenches 406, a plurality of gate structure 415, a gate oxide layer 410, a plurality of P-body regions 420, a plurality of P+ heavily-doped regions 421, a plurality of active N+ doping regions 425, a insulating layer 430, a plurality of metal contact plugs (437a, 437b, 437c, and 437d), a plurality of metal layer 460, and a guard ring 470. The metal layer 460 comprised a first metal layer region 460a, a second metal layer region 460b, and a third metal layer 460c is formed on the top of the MOSFET structure, and the first metal layer region 460a, the second metal layer region 460b, and the third metal layer 460c are formed as the source metal, the gate runner, and the field plate metal of the MOSFET respectively. The gate structure 415 comprised the first gate 415a, and the second gate 415b which are covered the gate oxide layer 410 and are filled in the trenches 460 to be used as a gate of the MOSFET. The insulating layer 430 is formed between the metal layer 460 and the gate structure 415 for insulating, and the contact plugs 437a, 437b, 437c, and 437d are penetrated through the insulating layer 430 and contacted with the metal layer 460 respectively. Although the MOSFET structure of the present invention has a partial structure which is similar to prior arts, the guard ring 470 is particularly different from the prior arts. The guard ring 470 wraps around the contact plug 437a, the contact plug 437d and the first gate 415a underneath the first gate 415a while the first metal layer region 460a and the second metal layer region 460b of the metal layer 460 covers the contact plug 437d and the contact plug 437a, respectively. The channel stop 490a is formed at the termination aside the guard ring 470, and the N* doping regions 491 are formed underneath bottom of the trenches 406. The channel stop 490a provides heavier doping concentration than epi to avoid any negative charge in the dielectric inducing positive charge at silicon/dielectric interface to make high leakage path in termination area, and the N* doping regions 491 provide lower Rds without significantly degrading breakdown voltage.

Figure 5:
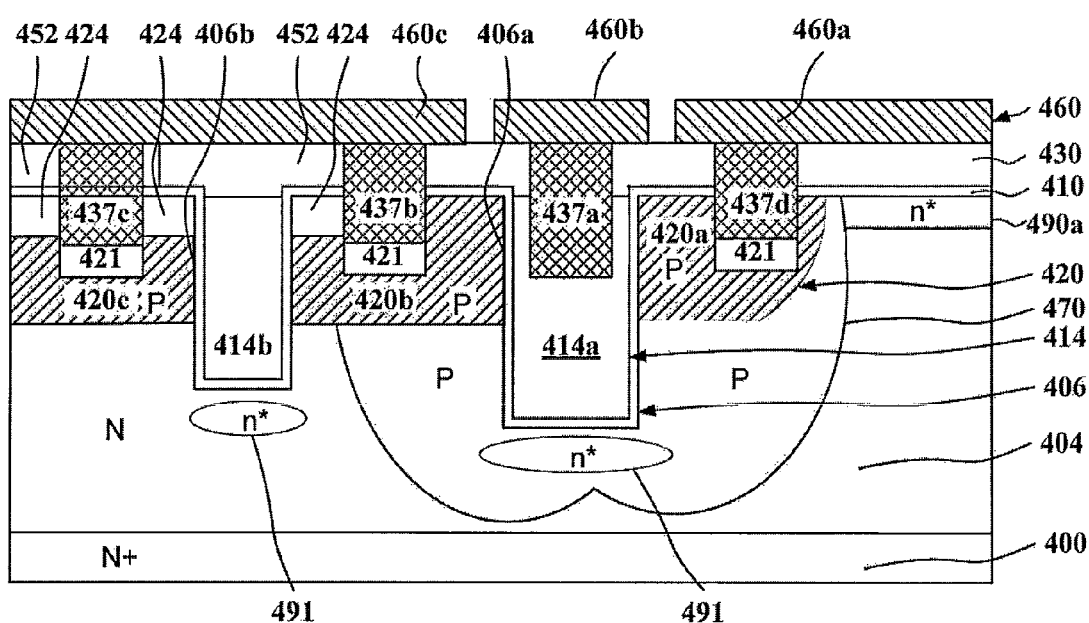
FIG. 5 is a cross-sectional diagram illustrating the trenched MOSFET with a guard ring and a channel stop in accordance with another embodiment of the present invention.

Referring to FIG. 5, according to the embodiment said above, the guard ring 470 can wrap around the contact plug 437a, the contact plug 437b, the contact plug 437d, and the first gate 415a underneath the first gate 415a while the first metal layer region 460a, the second metal layer region 460b, and the third metal layer 460c of the metal layer 460 covers the contact plug 47a, the contact plug 437b, the contact plug 437d, and the first gate 415 on another way.

Although various embodiments are specifically illustrated and described herein, it will be appreciated that modifications and variations of the present invention are covered by the above teachings and are within the purview of the appended claims without departing from the spirit and intended scope of the invention.

What is claimed is:

1. A trenched MOSFET with a guard ring and a channel stop, comprising:
    a substrate of a first conductivity doping type including an epi layer of said first conductivity doping type formed on said top thereof with doping concentration less than said substrate;
    a plurality of sources of said first conductivity doping type formed in said epi layer and a plurality of body regions of a second conductivity doping type formed beneath said sources in said epi layer;
    an insulating layer formed on said epi layer;
    a plurality of a first type trenches vertically extending from a surface of said epi layer into said source and said body regions and having an gate oxide layer formed thereon, the first type trenches being filled with a doped polysilicon layer as trenched gates for current conduction;
    at least one second type trench having an gate oxide layer formed thereon, the second type trench being deeper and wider than said first type trench vertically extending from said surface of said epi layer into said body regions, said second type trench filled with said doped polysilicon as trenched contact gate;
    a first metal contact plug penetrating through said insulating layer and extending into said second type trench, said first metal contact plug being connected to a first metal layer formed on said insulating layer, said first metal contact serving as gate metal in a termination area of a chip;
    a plurality of second metal contact plugs, each penetrating through said insulating layer and one of said source, and extending into said body regions separated by said first type trenches and said second type trenches, said metal contact plugs being connected to a second metal layer formed on said insulating layer, said second metal layer serving as source metal;
    a guard ring formed in said termination area of said chip, said guard ring extending inwardly from said top surface of said epi layer, said guard ring having a junction depth deeper than that of said body region and contacting said body region with doping concentration less than said body region, said guard ring having said second conductivity doping type and having a doping concentration $10^{15} \sim 10^{17}$ cm$^{-3}$; and
    a channel stop region formed beneath said top surface of said epi layer near an edge of said chip, said channel stop region contacting said guard ring in said termination area and having said first conductivity doping type with a doping concentration heavier than said epi layer,
    wherein said gate metal above said guard ring in said termination area serving as a metal field plate for breakdown voltage enhancement.

2. The trenched MOSFET with said guard ring and said channel stop as claimed in claim 1, wherein said guard ring is arranged outside of said trenched contact gate.

3. The trenched MOSFET with said guard ring and said channel stop as claimed in claim 1, wherein said guard ring surrounds said trenched contact gate region.

4. The trenched MOSFET with said guard ring and said channel stop as claimed in claim 1, wherein the MOSFET structure comprises a plurality of transistors formed in a N-type doping epi region on the heavily doped N-type substrate.

5. The trench MOSFET with said guard ring and said channel stop as claimed in claim 1, further comprising a plurality of doping regions of said first conductivity doping type, each of the doping regions is arranged underneath a bottom of one of the trenched gates with doping concentration heavier than said epi layer for lower on-resistance (Rds).

6. The trenched MOSFET with said guard ring and said channel stop as claimed in claim 1, wherein a plurality of heavily p-type doped regions are disposed at the bottoms of said metal contact plugs.

7. The trenched MOSFET with said guard ring and said channel stop as claimed in claim 1, wherein said gate oxide layer in trenched gates is single oxide of which oxide thickness nearly uniform along trench sidewall and bottom.

8. The trenched MOSFET with said guard ring and a said channel stop as claimed in claim 1, wherein said gate oxide layer at the bottoms of said trenched gates has a significant larger thickness than trench sidewall so as to reduce the capacitance of said gate oxide layer.

* * * * *